(12) United States Patent
Leizerovich et al.

(10) Patent No.: US 12,108,581 B2
(45) Date of Patent: Oct. 1, 2024

(54) MULTI-CHAMBERED SHIELD ENCLOSURE FOR VERTICALLY STACKED MODULE ARRANGEMENT AND ELECTRONIC APPARATUS INCORPORATING SAME

(71) Applicant: Ubicquia, Inc., Fort Lauderdale, FL (US)

(72) Inventors: Gustavo Dario Leizerovich, Aventura, FL (US); Ivan Quiroz, Aventura, FL (US); Claudio Santiago Ribeiro, Evanston, IL (US); Cesar Eduardo Nunez, Miramar, FL (US); Steven Kenneth Mackiewicz, Shorewood, IL (US)

( * ) Notice: Subject to any disclaimer, the term of this patent is extended or adjusted under 35 U.S.C. 154(b) by 205 days.

(21) Appl. No.: 17/952,183

(22) Filed: Sep. 23, 2022

(65) Prior Publication Data

US 2023/0209790 A1   Jun. 29, 2023

Related U.S. Application Data

(63) Continuation-in-part of application No. 17/567,116, filed on Jan. 1, 2022, now Pat. No. 11,844,151, and a
(Continued)

(51) Int. Cl.
  *H05K 9/00* (2006.01)
  *H04B 1/38* (2015.01)
  *H05K 7/20* (2006.01)

(52) U.S. Cl.
  CPC ............. *H05K 9/0037* (2013.01); *H04B 1/38* (2013.01); *H05K 9/0015* (2013.01);
  (Continued)

(58) Field of Classification Search
  CPC ............................ H05K 1/144; H05K 5/0021
  See application file for complete search history.

(56) References Cited

U.S. PATENT DOCUMENTS

| | | | | |
|---|---|---|---|---|
| 4,370,700 A | * | 1/1983 | Duddles | H05K 9/0037 361/752 |
| 5,777,856 A | * | 7/1998 | Phillips | H04M 1/0277 361/752 |

(Continued)

FOREIGN PATENT DOCUMENTS

| | | | | |
|---|---|---|---|---|
| CN | 211702797 U | 10/2020 | | |
| EP | 2034328 A1 | * | 3/2009 | G01S 7/032 |

OTHER PUBLICATIONS

EP-2034328-A1 English translation (Year: 2009).*
(Continued)

*Primary Examiner* — Mukundbhai G Patel
(74) *Attorney, Agent, or Firm* — Daniel C. Crilly; Scott Garrett

(57) ABSTRACT

A vertically oriented, electrically conductive enclosure includes at least three shield members. A first member has a first floor and a first sidewall that extends away from the first floor around a periphery of the first shield floor. A second member is electrically coupled to the first member and has a second floor and a second sidewall. A first portion of the second sidewall extends away from the second floor in a first direction. A second portion of the second sidewall extends away from the second floor in a second direction opposite to the first direction and engages the first sidewall. A third member is electrically coupled to the second member and has a shield cover and a third sidewall. The third sidewall extends away from the shield cover about a periphery of the shield cover and engages the first portion of the second sidewall.

20 Claims, 14 Drawing Sheets

Related U.S. Application Data continuation-in-part of application No. 17/563,783, filed on Dec. 28, 2021, now Pat. No. 11,792,964.

(52) U.S. Cl.
CPC .......... *H05K 9/0058* (2013.01); *H05K 9/006* (2013.01); *H05K 7/20145* (2013.01)

(56) References Cited

U.S. PATENT DOCUMENTS

| | | | |
|---|---|---|---|
| 6,364,216 | B1 | 4/2002 | Martin |
| 6,624,432 | B1 | 9/2003 | Gabower et al. |
| 8,018,734 | B2 * | 9/2011 | Brewer ............... H05K 5/0278 361/818 |
| 9,192,079 | B2 * | 11/2015 | Loth ................. H05K 7/20918 |
| 11,653,436 | B2 | 5/2023 | Vendetti et al. |
| 11,844,151 | B2 | 12/2023 | Leizerovich et al. |
| 2018/0027359 | A1 | 1/2018 | Gonzalez et al. |
| 2018/0045388 | A1 | 2/2018 | McDowell et al. |
| 2019/0341732 | A1 | 11/2019 | Zimmerman et al. |
| 2020/0080695 | A1 | 3/2020 | Lalos et al. |
| 2020/0195304 | A1 | 6/2020 | Vannucci et al. |
| 2020/0359462 | A1 | 11/2020 | Zimmerman, III et al. |
| 2020/0373682 | A1 | 11/2020 | Root et al. |
| 2021/0100065 | A1 * | 4/2021 | Lee ..................... H05K 7/1417 |
| 2021/0167811 | A1 | 6/2021 | Henry et al. |
| 2021/0305689 | A1 | 9/2021 | Leizerovich |

OTHER PUBLICATIONS

U.S. Patent & Trademark Office as International Searching Authority, International Search Report issued in connection with International Application No. PCT/US22/54121, Apr. 18, 2023, 2 pages.

U.S. Patent & Trademark Office as International Searching Authority, Written Opinion of the International Searching Authority in connection with International Application No. PCT/US22/54121, Apr. 18, 2023, 6 pages.

U.S. Patent & Trademark Office as International Searching Authority, International Search Report issued in connection with International Application No. PCT/US22/54128, Apr. 5, 2023, 2 pages.

U.S. Patent & Trademark Office as International Searching Authority, Written Opinion of the International Searching Authority in connection with International Application No. PCT/US22/54128, Apr. 5, 2023, 4 pages.

U.S. Patent & Trademark Office as International Searching Authority, International Search Report issued in connection with counterpart International Application No. PCT/US22/54123, Jun. 21, 2023, 4 pages.

U.S. Patent & Trademark Office as International Searching Authority, Written Opinion of the International Searching Authority in connection with counterpart International Application No. PCT/US22/54123, Jun. 21, 2023, 5 pages.

\* cited by examiner

MULTI-CHAMBERED SHIELD ENCLOSURE FOR VERTICALLY STACKED MODULE ARRANGEMENT AND ELECTRONIC APPARATUS INCORPORATING SAME

CROSS-REFERENCE TO RELATED APPLICATIONS

The present application is a continuation-in-part of U.S. application Ser. No. 17/563,783, which application was filed on Dec. 28, 2021, and is incorporated herein by this reference as if fully set forth herein. The present application is also a continuation-in-part of U.S. application Ser. No. 17/567,116, which application was filed on Jan. 1, 2022, and is incorporated herein by this reference as if fully set forth herein.

TECHNICAL FIELD

The present disclosure relates generally to electronic apparatus that include shielded circuitry and, more particularly, to a multi-chambered shield enclosure for a vertically stacked module arrangement and an electronic apparatus incorporating same.

BACKGROUND

Wireless communication service is in widespread use, with a rapidly increasing number of devices being deployed that need wireless connectivity. In particular, as people use their mobile devices more for data services than voice calls, there is an increasing need for data access. Given that there is a limitation on available radio bandwidth for such services, service provides are scaling down service areas so that spectrum allocation can be repeated in smaller cells. This means that rather than using towers that cover conventional cell regions under prior systems, which can be miles across, new systems will use small cells that are more like wireless local area networks than traditional cellular communications cells. As a result, small cell access nodes will be deployed in much higher numbers than traditional cellular base stations.

There are a couple challenges with deploying small cell access nodes, which are deployment locations, and avoiding noise that can affect receiver performance. The noise can include noise generated by the small cell access node itself, such as, for example, passive intermodulation distortion. Therefore, a need exists to overcome the problems with the prior art as discussed above.

SUMMARY

In accordance with some exemplary embodiments of the present disclosure, a multi-chambered, electrically conductive enclosure for use in an electronic apparatus includes at least three shield members in a particular configuration. A first shield member has a first floor and a first sidewall that extends away from the first floor around a periphery of the first floor. A second shield member is electrically coupled to the first shield member and has a second floor and a second sidewall. A first portion of the second sidewall extends away from the second floor in a first direction and a second portion of the second sidewall extends away from the second floor in a second direction opposite the first direction. The second portion of the second sidewall meets, interfaces with, or otherwise engages the first sidewall. A third shield member is electrically coupled to the second shield member and has a cover and a third sidewall. The third sidewall extends away from the cover about a periphery of the cover and meets, interfaces with, or otherwise engages the first portion of the second sidewall. The first floor, the first sidewall, the second portion of the second sidewall, and the second floor define a first shielded chamber. The second floor, the first portion of the second sidewall, the third sidewall, and the cover define a second shielded chamber. The first shielded chamber and the second shielded chamber are in a vertically stacked orientation.

According to an additional exemplary embodiment, the second floor defines at least one opening through which electrical power may be conveyed between circuits positioned in the first and second shielded chambers.

According to an alternative embodiment, the multi-chambered enclosure may include at least two cable ports and at least two gaskets. In this embodiment, a first cable port is positioned at a first interface between the first sidewall and the second portion of the second sidewall. A first gasket is disposed along the first interface and the first cable port. A second cable port is positioned at a second interface between the first portion of the second sidewall and the third sidewall. A second gasket is disposed along the second interface and the second cable port.

According to yet another exemplary embodiment, the cover forming part of the third shield member may define an optical port and include a transparent window disposed over the optical port. Inclusion of the optical port facilitates use of an optical sensor as part of a control circuit or other circuit positioned in the second shielded chamber.

According to yet another exemplary embodiment, the multi-chambered enclosure may include a satellite location receiver port and a satellite location receiver antenna (e.g., GPS antenna). In this case, the satellite location receiver port is formed in the cover forming part of the third shield member and the satellite location receiver antenna is disposed in the satellite location receiver port.

According to other exemplary embodiments of the present disclosure, an electronic apparatus includes a housing, a multi-chambered, electrically conductive enclosure, and at least two circuits. The housing includes an electrically conductive housing floor, an electrically non-conductive housing sidewall disposed about a periphery of the housing floor, and an electrically non-conductive housing cover engaged with the housing sidewall but not the housing floor. The housing floor, the housing sidewall, and the housing cover define an internal chamber of the housing. The multi-chambered enclosure is positioned within the internal chamber of the housing and electrically coupled to the housing floor. The enclosure defines a first shielded chamber and a second shielded chamber in a vertically stacked arrangement. One of the at least two circuits is positioned within the first shielded chamber and another one of the at least two circuits is positioned within the second shielded chamber. According to one exemplary embodiment, the circuit positioned within the first shielded chamber is a power supply circuit and the circuit positioned within the second shielded chamber is a control circuit.

According to an alternative exemplary embodiment, the multi-chambered enclosure includes at least three shield members in a particular configuration. A first shield member has a first floor and a first sidewall that extends away from the first floor around a periphery of the first floor. The first shield member is electrically coupled to the housing floor. A second shield member is electrically coupled to the first shield member and has a second floor and a second sidewall. A first portion of the second sidewall extends away from the second floor in a first direction and a second portion of the second sidewall extends away from the second floor in a second direction opposite the first direction. The second portion of the second sidewall meets, interfaces with, or otherwise engages the first sidewall. A third shield member is electrically coupled to the second shield member and has a cover and a third sidewall. The third sidewall extends away from the cover about a periphery of the cover and meets, interfaces with, or otherwise engages the first portion of the second sidewall. The first floor, the first sidewall, the second portion of the second sidewall, and the second floor define a first shielded chamber. The second floor, the first portion of the second sidewall, the third sidewall, and the cover define a second shielded chamber.

According to an alternative exemplary embodiment, the multi-chambered enclosure includes three shield members are in a vertically stacked arrangement such that a first shield member is electrically coupled to the housing floor and all three shield members are electrically coupled together. According to this embodiment, intercoupling of the first shield member and the second shield member defines the first shielded chamber and intercoupling of the second shield member and the third shield member defines the second shielded chamber.

According to yet another alternative exemplary embodiment, the multi-chambered enclosure includes a cover member. The cover member defines an optical port and includes a transparent window disposed over the optical port. In such a case and where the electronic apparatus is mountable to an aerial light fixture, the housing cover defines a second optical port, and the multi-chambered enclosure is positioned within the internal chamber of the housing such that the optical port of the enclosure's cover member substantially aligns with the second optical port. Additionally, the first circuit includes a light control circuit and is oriented within the first shielded chamber such that a light sensor of the light control circuit is positioned under the transparent window of the enclosure's cover member. The light control circuit controls light output of the light fixture based at least in part on an ambient light level detected by the light sensor through the transparent window of the enclosure's cover member.

In yet another embodiment where the circuit positioned within the first shielded chamber is a power supply circuit, the electronic apparatus may include an electrical power connector that passes alternating current (AC) power through a first opening defined by the housing floor, a power cable routing the AC power to the power supply circuit, and a second power cable that routes direct current (DC) power output from the power supply circuit to the circuit positioned within the second shielded chamber. The DC power may be routed through one or more openings defined by the first shielded chamber and the second shielded chamber.

According to yet another exemplary embodiment, the electronic apparatus and/or its housing may be mountable to an aerial light fixture and optionally receive AC power from the aerial light fixture. In such a case, the housing cover and a cover member of the shield enclosure may each define a respective optical port. The enclosure may be positioned within the internal chamber of the housing such that the optical port of the enclosure's cover member substantially aligns with the optical port of the housing cover. A control circuit may be positioned within the first shielded chamber of the enclosure such that a light sensor of the control circuit is positioned under a transparent window of the enclosure's cover member. The control circuit may then control light output of the light fixture based at least in part on an ambient light level detected by the light sensor through the transparent window.

According to yet another exemplary embodiment, the electronic apparatus may be a small cell node, a base station, or a repeater and include a radio module disposed within the internal chamber of the housing horizontally adjacent to the shielded enclosure. In such a case, the circuit positioned within the second shielded chamber may be an AC-to-DC power supply circuit to supply DC power to a circuit positioned within the first shielded chamber and/or the radio module. Additionally or alternatively, the electronic apparatus may include a satellite location receiver port formed in a cover of the enclosure, a satellite location receiver antenna disposed in the satellite location receiver port, and a satellite location receiver circuit coupled to the satellite location receiver antenna and forming part of the control circuit.

In accordance with other exemplary embodiments of the present disclosure, an integrated small cell access node includes a housing having a floor that is electrically conductive, a sidewall disposed about a periphery of the floor that is non-conductive, and a cover engaged with the sidewall opposite the floor that is non-conductive. An internal chamber is defined within the housing by the floor, sidewall, and cover. There is further a shield enclosure for a combination power supply and controller module disposed in the internal chamber of the housing and conductively coupled to the floor of the housing, and the enclosure has a lower chamber and an upper chamber in a vertically stacked relationship.

In accordance with some embodiments of the present disclosure, there is provided a small cell access node apparatus that includes a lower housing member made of an electrically conductive material. The lower housing member has a floor and a back wall at a first end of the lower housing member. The apparatus further includes a sidewall housing member connected to the lower housing member about a periphery of the lower housing member, and the sidewall housing member forms a wall around the floor. The apparatus further includes a cover that engages a top of the sidewall housing member about a periphery of the top of the sidewall housing member. An internal chamber is defined between the floor and cover and surrounded by the sidewall housing member and back wall of the lower housing member. The apparatus further includes a radio module disposed in the internal chamber proximate the back wall of the lower housing member, and a shielded enclosure for a combination power supply and controller module disposed in the internal chamber proximate to a second end of the lower housing member and horizontally adjacent the radio module. The shielded enclosure is conductively coupled to the floor of the lower housing member and has a lower chamber and an upper chamber in a vertically stacked relationship and separated by a central floor that is conductive. There is a power supply circuit disposed in the lower chamber and a control circuit disposed in the upper chamber.

In accordance with some embodiments of the present disclosure, there is provided a shielded enclosure for a combination control circuit and power supply module for a small cell access node apparatus that includes a lower shielding member having a bottom that forms a floor, and a sidewall that extends away from the bottom around a periphery of the bottom. The apparatus further includes a central shielding member conductively coupled to the lower shielding member that has a central floor, and further has a sidewall around a periphery of the central floor. The sidewall of the central shielding member has a lower portion that extends away from the central floor in a first direction, and which meets the sidewall of the lower shielding member. The sidewall of the central shielding member further has an upper portion that extends from the central floor in a second direction opposite that of the first direction, and thereby encloses a lower chamber between the bottom of the lower shielding member and a lower side of the central floor of the central shielding member and the lower portion of the sidewall of the central shielding member and the sidewall of the lower shielding member. The apparatus further includes a top shielding member conductively coupled to the central shielding member and having a ceiling and a sidewall. The sidewall of the top shielding member extends away from the ceiling about a periphery of the ceiling to meet the upper portion of the sidewall of the central shielding member thereby enclosing an upper chamber between an upper side of the central floor and the ceiling of the top shielding member and by the upper portion of the sidewall of the central shielding member and the sidewall of the top shielding member. The apparatus further includes a power supply circuit disposed in the lower chamber, and a control circuit disposed in the upper chamber.

Although the present disclosure illustrates and describes a small cell access node apparatus, and a vertically stacked electrical module, it is, nevertheless, not intended to be limited to the details shown because various modifications and structural changes may be made therein without departing from the spirit of the disclosure and while remaining within the scope and range of equivalents of the claims. Additionally, well-known elements of the invention will not be described in detail or will be omitted so as not to obscure the relevant details of the invention.

Features that are considered characteristic of the invention are set forth in the appended claims. As required, detailed embodiments of the small cell housing are disclosed herein; however, it is to be understood that the disclosed embodiments are merely exemplary, and the housing may be embodied in various forms. Therefore, specific structural and functional details disclosed herein are not to be interpreted as limiting, but merely as a basis for the claims and as a representative basis for teaching one of ordinary skill in the art to variously employ the claimed invention in appropriately detailed structures. Further, the terms and phrases used herein are not intended to be limiting; but rather, to provide an understandable description of the disclosure. While the specification concludes with claims defining the features of the invention, it is believed that the claimed invention will be better understood from a consideration of the following description in conjunction with the drawing figures, in which like reference numerals are carried forward. The figures of the drawings are not drawn to scale.

The terminology used herein is for the purpose of describing particular embodiments only and is not intended to be limiting. The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically. The term "providing" is defined herein in its broadest sense, e.g., bringing/coming into physical existence, making available, and/or supplying to someone or something, in whole or in multiple parts at once or over a period of time.

As used in this description and the appended claims, the term "small cell" or "small cell access node" refers to a low-powered radio access node or device that operates in licensed or unlicensed spectrum having a range of ten meters to a few kilometers and which may help provide wireless communication service to indoor and/or outdoor areas. Small cells or small cell access nodes may be femtocells, picocells, or microcells.

As used in this description, unless otherwise specified, azimuth or positional relationships indicated by terms such as "up", "down", "left", "right", "inside", "outside", "front", "back", "head", "tail" and so on, are azimuth or positional relationships based on the drawings, which are only to facilitate description of the embodiments of the present invention and simplify the description, but not to indicate or imply that the devices or components must have a specific azimuth, or be constructed or operated in the specific azimuth, which thus cannot be understood as a limitation to the embodiments of the present invention. Furthermore, terms such as "first", "second", "third" and so on are only used for descriptive purposes and cannot be construed as indicating or implying relative importance.

As used in this description, unless otherwise clearly defined and limited, terms such as "installed", "coupled", "connected" should be broadly interpreted, for example, it may be fixedly connected, or may be detachably connected, or integrally connected; it may be mechanically connected, or may be electrically connected; it may be directly connected or may be indirectly connected via an intermediate medium. As used herein, the terms "about" or "approximately" apply to all numeric values, whether or not explicitly indicated. These terms generally refer to a range of numbers that one of skill in the art would consider equivalent to the recited values (i.e., having the same function or result). In many instances these terms may include numbers that are rounded to the nearest significant figure. In this document, the term "longitudinal" should be understood to mean in a direction corresponding to an elongated direction of the device. Those skilled in the art can understand the specific meanings of the above-mentioned terms in the embodiments of the present disclosure according to the specific circumstances.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and explain various principles and advantages all in accordance with the present disclosure.

DETAILED DESCRIPTION

Figure 1:
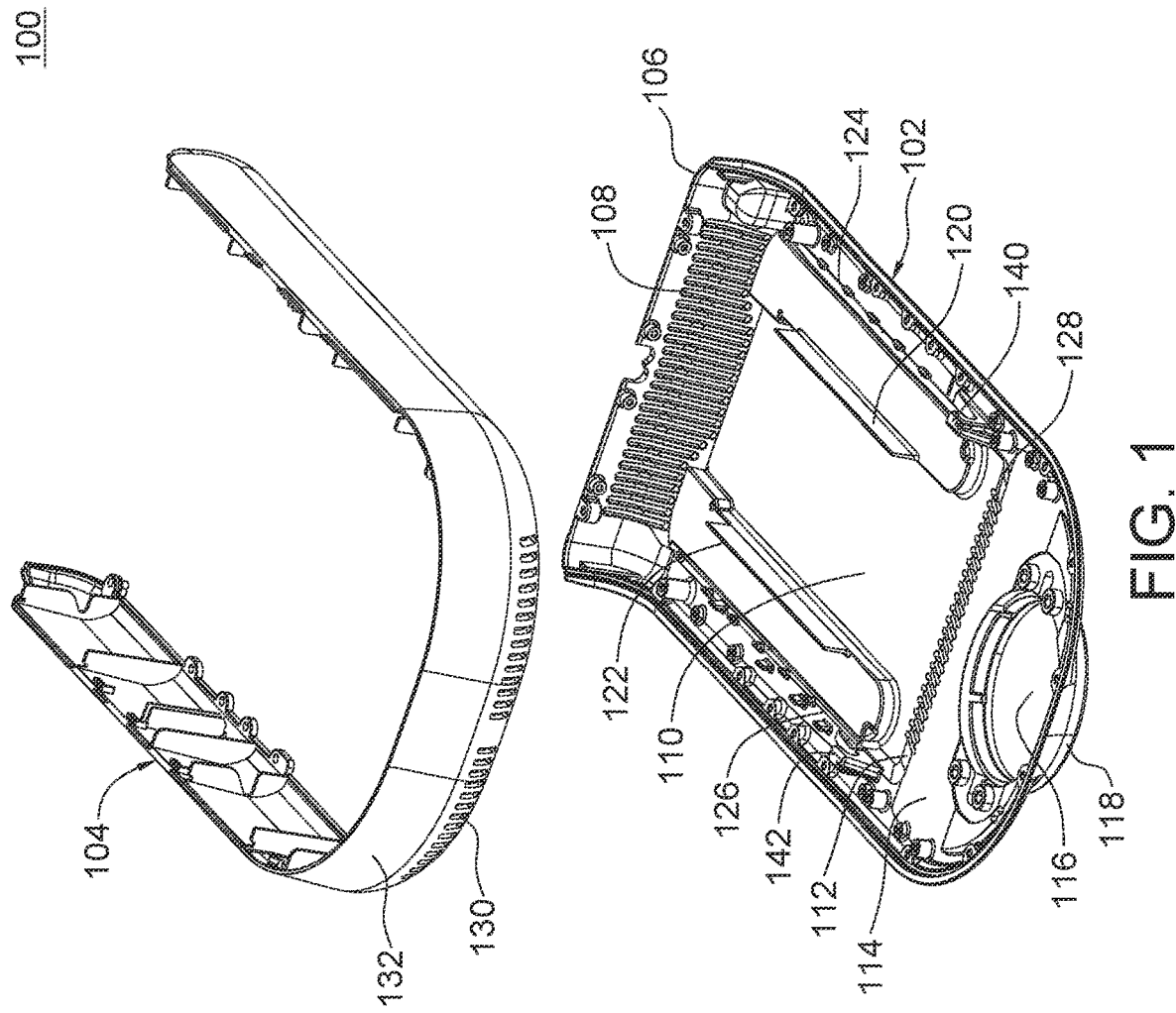
FIG. 1 shows a perspective exploded view of a small cell access node device for housing the electrical and electronic components of the small cell access node device, in accordance with some embodiments of the present disclosure.

FIG. 1 shows a perspective exploded view of a partial housing assembly 100 for an apparatus or device such as, for example, a small cell access node device, for housing the electrical and electronic components of the device, in accordance with some embodiments of the present disclosure. A small cell access node device is a telecommunications device that facilitates, among other things, communication between mobile devices and a telecommunications infrastructure. The subsequent drawings also show the housing assembly in various states and from various views, so like reference numerals are used throughout the drawings. Accordingly, reference can be made to any or all of the drawings in the following description.

In general, the housing assembly is arranged to house one or more electrical module that can include a power supply, radio circuitry, control circuitry, and peripheral circuitry. The device accomplishes this by drawing air in (cool air) at one end of an of the device, routing the intake air through one or more air flow channels under the electric module(s), and utilizing two separate exhaust ports for exhausting heated air out of the device at the end of the device opposite the intake. The exhaust ports are arranged in stages such a one exhaust port is located between the end of the device, at a bottom of the housing, and a second exhaust port is located at the opposite end of the device from the intake port.

As shown in the drawings, and referring to FIG. 1, there is shown a lower housing member 102 and a sidewall housing member 104. These members 102, 104 form a housing having a floor portion and a sidewall portion. The lower housing member 102 defines a floor and includes a back wall 106 that has an air intake section including an intake port 108 formed in the back wall 106. The back wall 106 can be considered a sidewall portion and is located at a first lengthwise end of the lower housing member 102 and has a width, in the horizontal direction, that is approximately equal to a width of the first floor portion 110 in a direction perpendicular to the lengthwise direction. The intake port 108 is comprised or one or more openings or air intake apertures through which air can be pulled into the housing from the outside, and into the device. The openings can be holes, slits, or any other shape, sized to prevent ingress of foreign matter. Alternatively, the opening(s) can be covered with a screen or mesh to keep out foreign matter. The lower housing member 102 is made of an electrically conductive material, such as aluminum, or a lightweight alloy, in order to provide sufficient rigidity and structure support of the components housed in the housing assembly. Further, making the lower housing member 102 of a metal provides a grounding plane for electrical and electronic components housed in the housing assembly.

The floor of the lower housing member 102 can include the first floor portion 110, which is a generally flat surface that is oriented horizontally when the device is horizontally oriented. The first floor portion extends substantially from the back wall 106 forward to the lower end 140 of a transition portion 112. The second floor portion 114 extends from the upper end 142 of the transition portion 112 forward to the second lengthwise end 144 of the lower housing member 102. The transition portion 112 is between the first floor portion 110 and a second floor portion 114, that is also generally flat, defining a plane that is parallel, but not coplanar with a plane of the first floor portion 110. That is, the first floor portion 110 and the second floor portion 114 are at different levels, and the transition portion 112 joins the two floor portions 110, 114. In some embodiments the transition portion 112 can be an angle less than ninety degrees relative to the two floor portions 110, 114, and in some embodiments the transition portion 112 can be at an angle of five to forty five degrees relative to the floor portions 110, 114, or alternatively, to the horizontal direction when the device is properly mounted and leveled. The transition portion 112 include a first exhaust port 128 that, like the intake port 108, is formed of a plurality of air exhaust apertures through which air can escape. In some embodiments the openings can be a series of longitudinal slits oriented in the lengthwise direction of the lower housing member 102. In some embodiments at least some of the openings in the first exhaust port 128 extend to the first floor portion 110 to facilitate water drainage out of the housing assembly 100 in the event of water ingress into the housing assembly 100. In some embodiments the first floor portion 110 and the second floor portion 114 can be slightly angled to direct any water that enters the device to flow across the floor portions 110, 114 towards the first exit port 128 to drain out of the device.

The second floor portion 114 can include an opening 116 that is sized to house a vertically oriented electrical connector (not shown here), such as an electrical connector (e.g., 138) configured to connect to an outdoor lighting fixture (e.g., a streetlight fixture). The electrical connector can be configured to connect to a lighting utility, such as a streetlight, as defined, for example, by the National Electrical Manufacturers Association (NEMA). Specifically, the connector can be a three conductor twist locking type. A boss 118 extends downward from the bottom of the lower housing member 102 around the opening 116 to support the electrical connector. The electrical connector can include a housing that fits within the opening 116 that seals the opening to weather.

The first floor portion 110 can include one or more medial walls, such as, for example, walls 120, 122. The walls 120, 122 run in the lengthwise direction of the lower housing member 102 from the back wall 106 towards the opposite end. The walls 120, 122 are raised portions that, when other components of the device are placed into the housing assembly 100, form air flow channels. For example, the walls 120, 122 can be spaced a distance from the sidewall to define air flow channels 124, 126 between the walls 120, 122, and the sidewall. The main or central air flow channel between the walls 120, 122 can be used to cool a heat-generating electrical module positioned over, but spaced apart from the first floor portion 110, with the heated air primarily exiting through the first exhaust portion 128. Side flow air channels 124, 126 can be used to route cool air around the space between walls 120, 122 to the front of the housing assembly, and to the second floor portion 114 where it can cool another heat-generating electrical module, with the air being exhausted through the second exhaust port 130 at the front 132 of the sidewall housing member 104.

The sidewall housing member 104 as shown here is a "U" shaped member that, along with back wall 106 provides the vertical sidewall of the housing from the lower housing member 102, and which, along with the other housing members, defines a volume inside the device that can be on the order of 7,085 cubic centimeters ±50%. The sidewall housing member 104 connects to the lower housing member 102 around a periphery of the lower housing member 102 and abuts the back wall 106 of the lower housing member 102 at opposite ends of the back wall 106. The back wall 106, in some embodiments, can rise up a portion of the sidewall housing member 104. The sidewall housing member 104 has a front 132 that is positioned opposite the back wall 106 of the lower housing member 102. A second exhaust port 130 is formed at the front 132 of the sidewall housing member 104. The second exhaust port 130 comprises one or more openings or air exhaust apertures through the sidewall member that allows air inside the sidewall housing member 104 to pass through the sidewall housing member 104. The overall height of assembled housing can be on the order of 30-150 millimeters.

Figure 2:
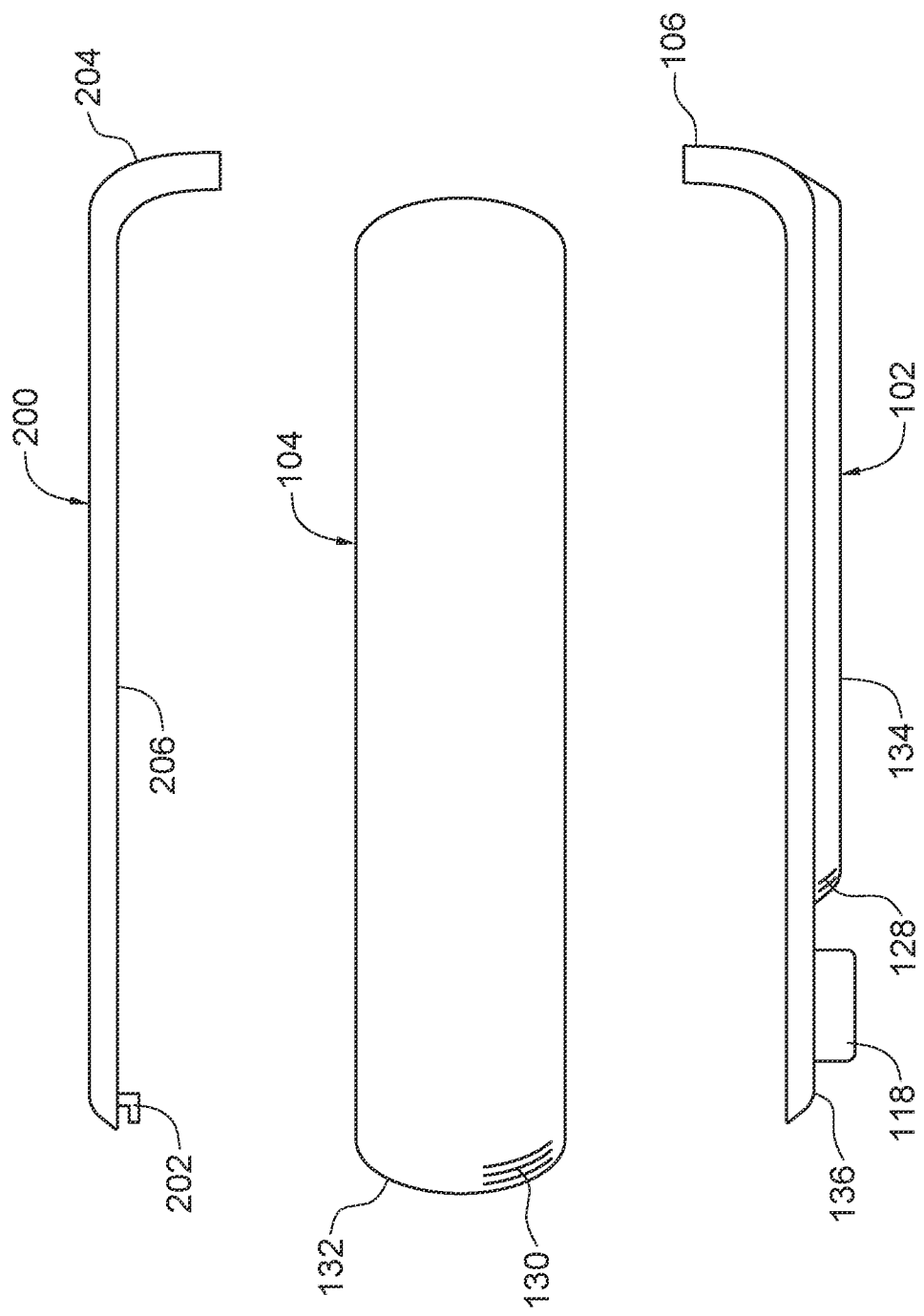
FIG. 2 shows a side elevational exploded view of a small cell access node device, in accordance with some embodiments of the present disclosure.

FIG. 2 shows a side elevational exploded view of a housing assembly for a small cell access node device, in accordance with some embodiments. In addition to the lower housing member 102, and the sidewall housing member 104, there is shown a cover housing member 200 that engages the top of the sidewall housing member 104. The cover housing member 200 can slide into engagement using a front catch feature 202. The cover housing member 200 also have a back wall portion 204 that can complement and align with the back wall 106 of the lower housing member 102 when the housing members 102, 104, 200 are assembled together to provide a complete cover of the back/rear of the housing assembly. The lower side edges 206 of the cover housing member 200 can have features to engage corresponding slide rail/track retention features in the sidewall housing member 104 on the inside top edge of the sidewall housing member 104. In this view, the underside 134 of the first floor portion 110 can be seen on the exterior bottom surface of the lower housing member 102. Likewise, the underside 136 of the second floor portion 114 can be seen adjacent the boss 118. The sidewall housing member 104 and the cover 200 are made of a dielectric material, such as plastic, which can include, for example, polyvinyl chloride (PVC), to allow electromagnetic signals to pass through the sidewall housing member 104 and cover 200 as well as to reduce the weight of the small cell device.

Figure 3:
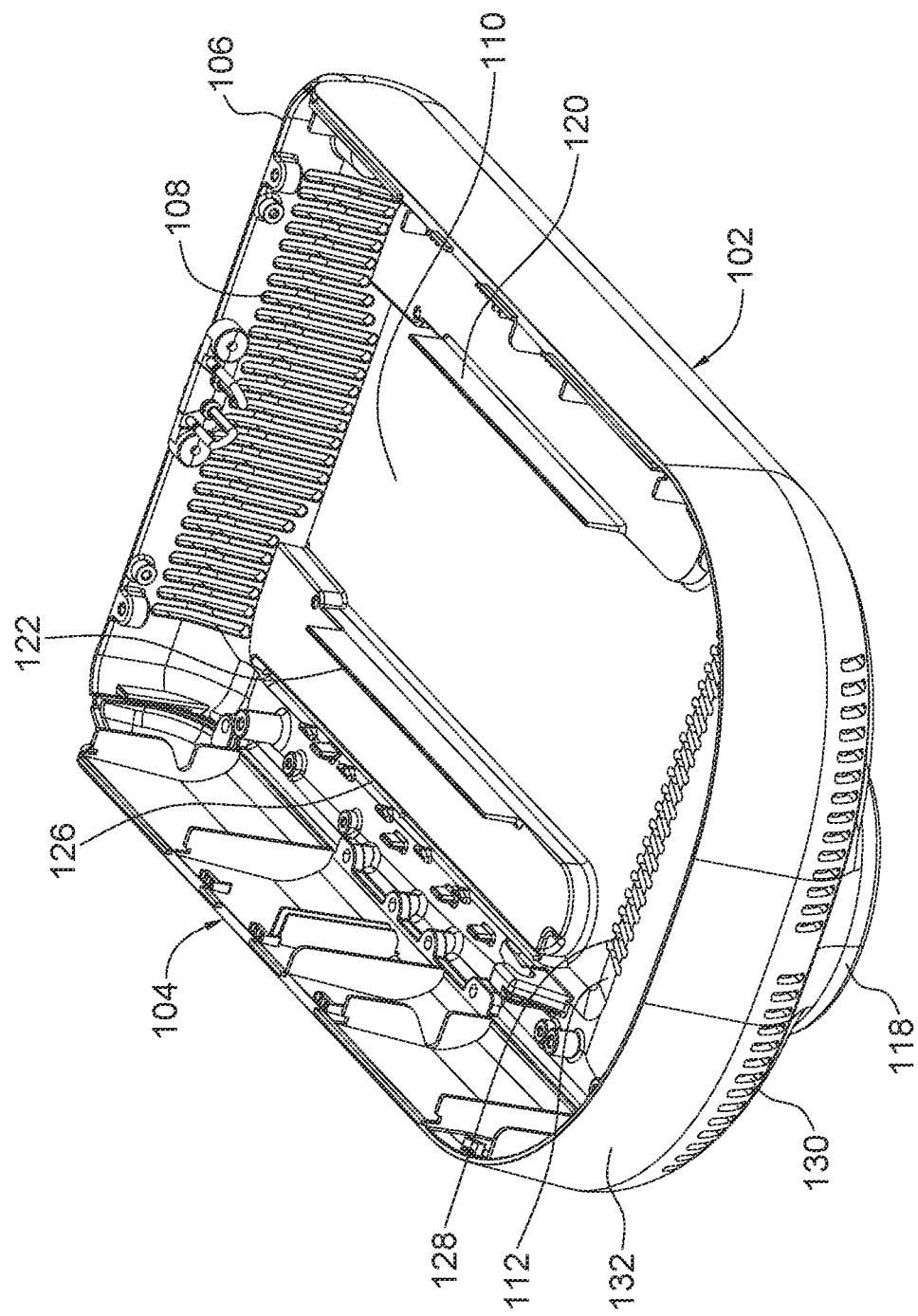
FIG. 3 shows a front perspective view partially assembled housing system for a small cell access node device, in accordance with some embodiments of the present disclosure.
Figure 4:
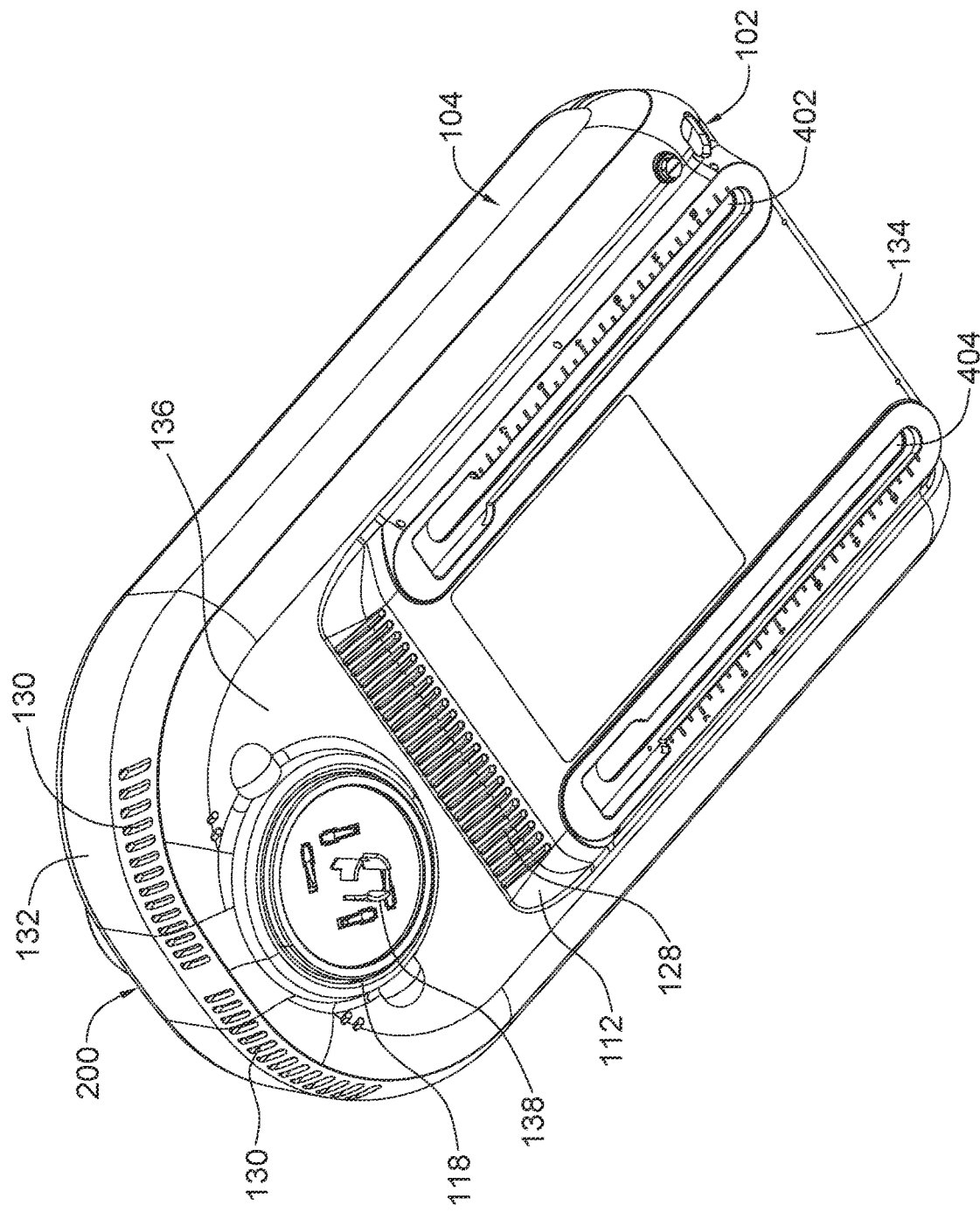
FIG. 4 shows a bottom perspective unassembled small cell access node device, in accordance with some embodiments of the present disclosure.
Figure 5:
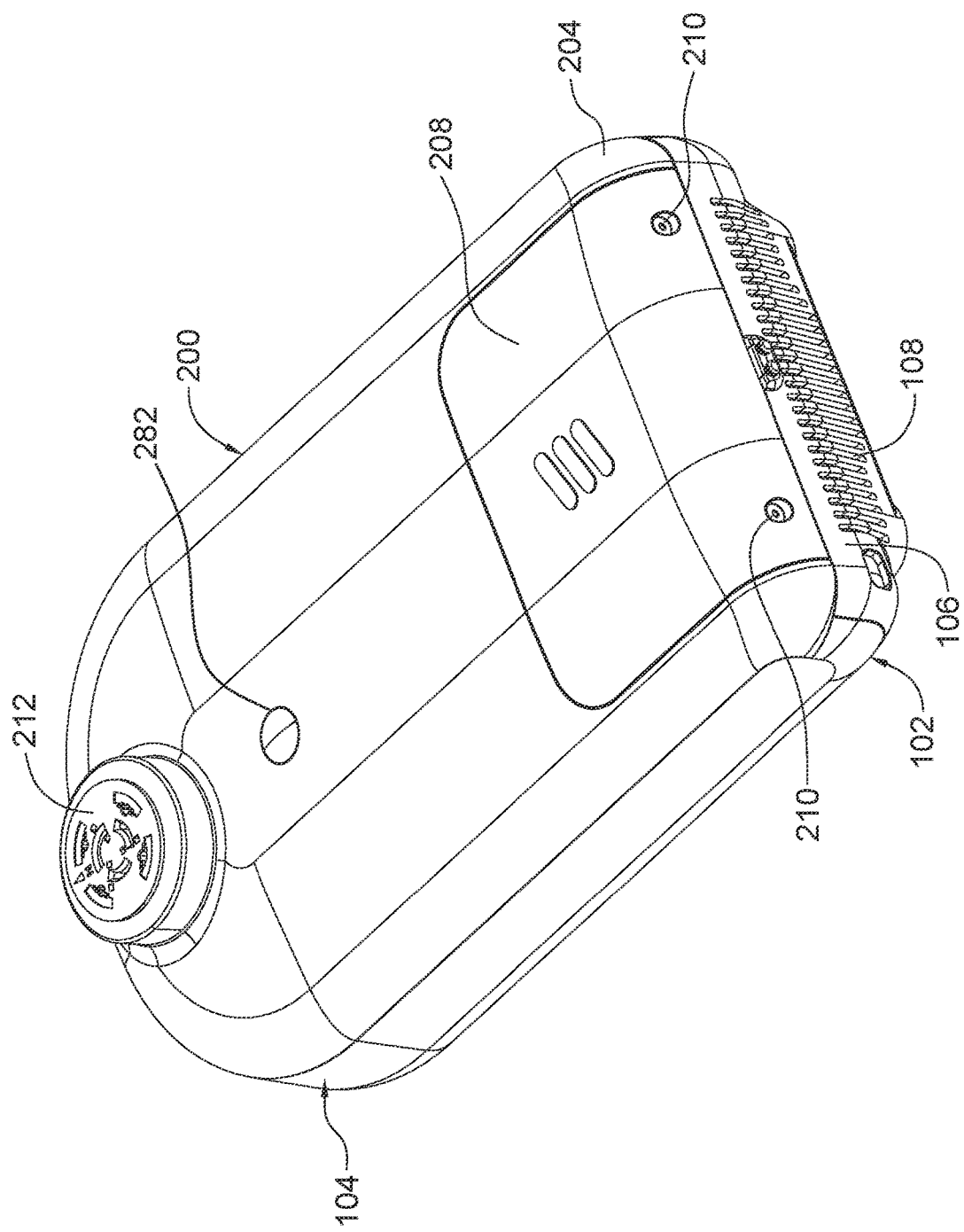
FIG. 5 shows a rear perspective view of an unassembled small cell access node device, in accordance with some embodiments of the present disclosure.

FIGS. 3-5 show various views of the housing member in different states. FIG. 3 shows a front perspective view with the lower housing member 102 and sidewall housing member 104 partially assembled. The second exhaust port 130 can be seen at the front 132 of the sidewall housing member 104 as a series of vertical slit openings through the front 132 of the sidewall housing member 104. As will be appreciated by those of ordinary skill in the art, different configurations of the openings or opening to form the second exhaust port 130 can be used. FIG. 4 shows a bottom perspective of the assembled small cell access node device in which the vertical electrical connector 138 can be seen in the opening of boss 118 and is configured to provide electrical power to components housed in the housing. Further, in FIG. 4 both the first exhaust port 128 and the second exhaust port 130 can both be seen. The first exhaust port 128 is in the transition portion 112 of the floor of the lower housing member 102, between the first floor portion and the second floor portion. Also, the undersides 134, 136 of the floor portions can be seen in this view. A pair of slots 402, 404 run in the lengthwise direction of the device and are formed in the first floor portion can provide the walls 120, 122 on the inside of the first floor portion and can provide for mechanical interconnecting to other devices or structures. In FIG. 5, the cover housing member 200 can be seen substantially covering the top of the device. The intake port 108 can be seen at the back wall 106 of the lower housing member 102. Further, the cover housing member 200 can be provided with an access door 208 that can be held in place using, for example, captured screws/bolts 210 that attach to the cover housing member 200 through the access door 208. The access door 208 is also made of a dielectric material. Additionally, the top electrical connector 212 can be provided in the cover housing member. The top electrical connector 212 is a vertically oriented electrical connector, similar to electrical connector 138 at the underside of the device, but which is a female connector that is configured to receive another device, such as, for example, a photometer to provide information about ambient light levels to an light fixture on which the small cell access node device is mounted, or to the small cell access node device itself to control the light output of a light fixture on which the small cell access node device is mounted. The top electrical connector 212 can be positioned directly over the vertical electrical connector 138.

Figure 6:
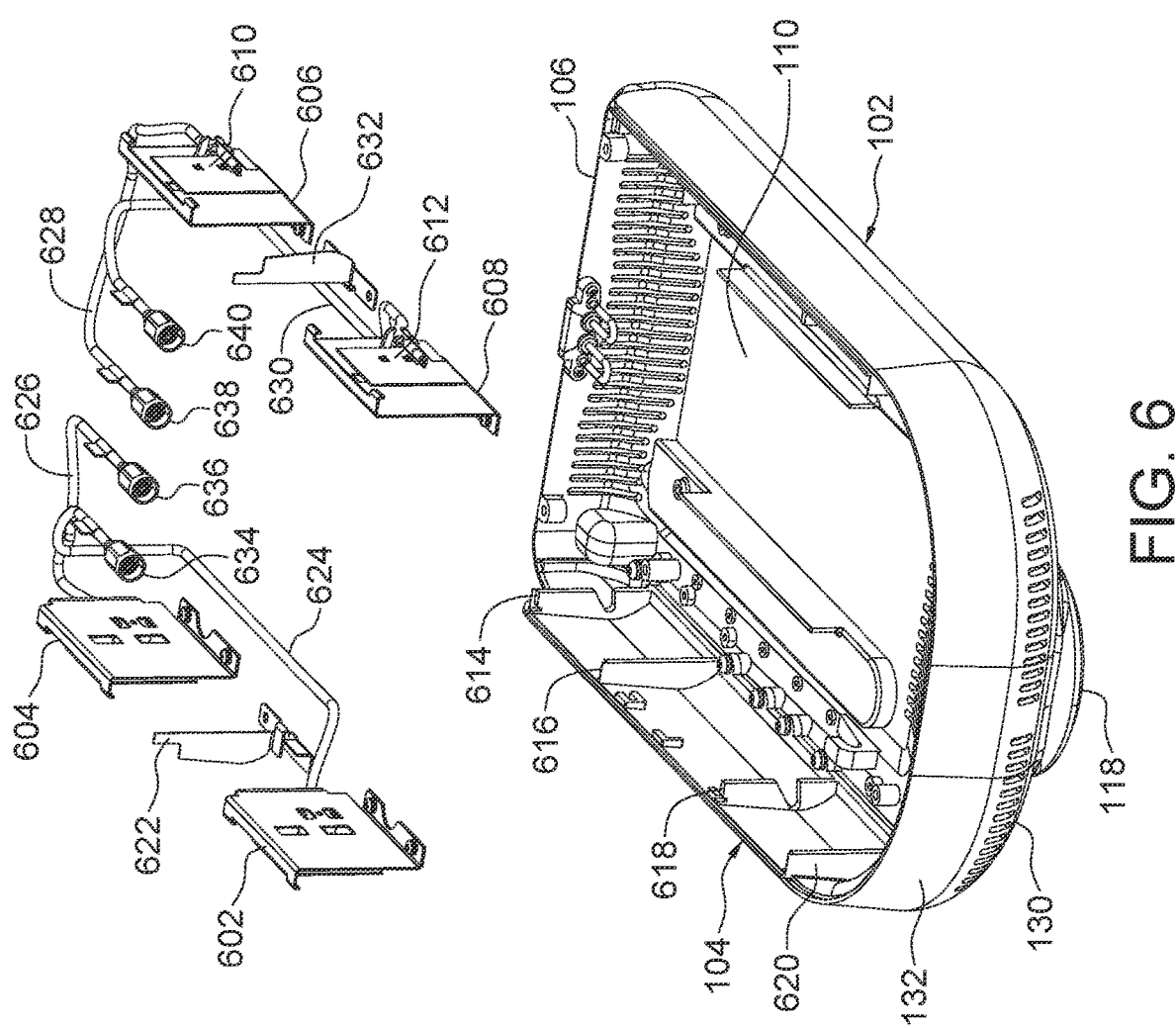
FIG. 6 shows a front perspective view partially assembled housing system for a small cell access node device in which planar antennas are assembled, in accordance with some embodiments of the present disclosure.

FIG. 6 shows a front perspective view partially assembled housing system for a small cell access node device in which planar antennas are assembled, in accordance with some embodiments of the present disclosure. As in FIGS. 1-5, the lower housing member 102 in conjunction with the sidewall housing member 104, and the back wall 106 of the lower housing member 102, define, generally, a space over the floor portions 110, 114 of the lower housing member 102. The space is bounded at the top by the cover member 200 (not shown here). Along the sidewall housing member 104 within that space there can be one or more antenna elements positioned to transmit and receive radio signals. In the present example there is shown four planar antenna units including planar antenna brackets 602, 604, 606, 608. The antenna brackets 602, 604, 606, 608 are made of an electrically conductive material and form a vertically oriented, generally planar element having an outward facing surface on which an antenna element is mounted, such as planar antenna elements 610, 612 on antenna brackets 606, 608, respectively. The antenna brackets 602, 604, 606, 608 mount on side wall features such as sidewall features 614, 616, 618, 620 which extend from the inner side of the sidewall member 104 into the internal space of the assembly, generally perpendicular to the inner surface of the sidewall member 104. In the present example antenna bracket 604 is mounted between sidewall features 614, 616 and antenna bracket 602 is mounted between sidewall features 618, 620. Further, between the antenna brackets, on each side of the sidewall housing member 104 there is a conductive blocking member 622, 632. The conductive blocking members 622, 632 are mounted on the conductive lower housing member 102 such that there is an electrical connection, and act to reduce signal interference between antenna members mounted on the antenna brackets on either side of the sidewall housing member 104. Each antenna element (e.g., 610, 612) is connected to a respective antenna cable 624, 626, 628, 630. Each of the antenna cables 624, 626, 628, 630 are terminated with a connector 634, 636, 68, 640. The antenna cables 624, 626, 628, 630 can be typical coaxial shielded cables that have a conductive core and a shielding element surrounding the core as is well known. It is important to note that the antenna elements are located inside the housing assembly. This is possible because the sidewall housing member 104 is made of a dielectric material that allows radio waves to pass through the sidewall housing member 104. By mounting the antenna elements inside the housing assembly, there is no need for externally mounted antennas, which can detract from the aesthetics of the assembly.

Figure 7:
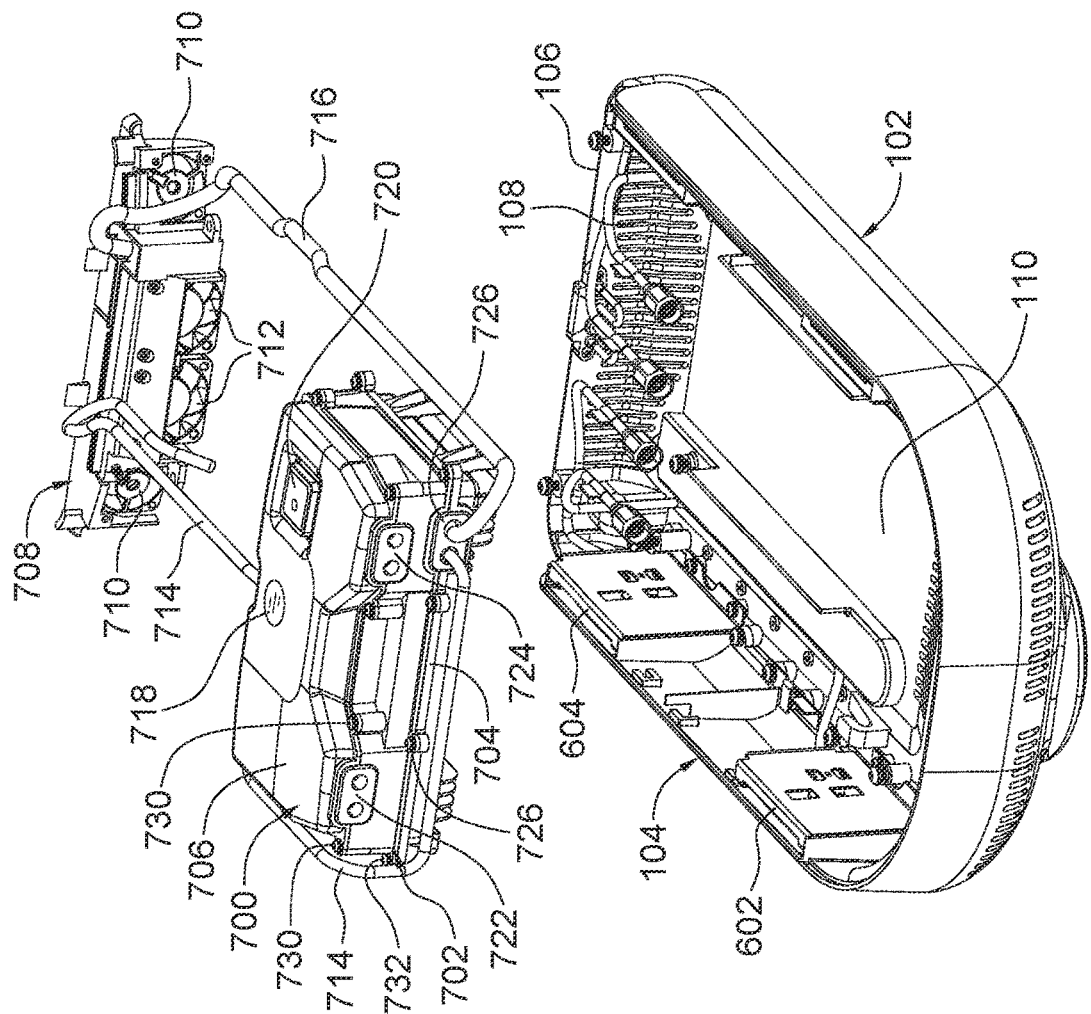
FIG. 7 shows a front perspective view partially assembled housing system for a small cell access node device as shown in FIG. 6 and in which a control circuit and power supply circuit are additionally assembled, in accordance with some embodiments of the present disclosure.

FIG. 7 shows a front perspective view partially assembled housing system for a small cell access node device as shown in FIG. 6 and in which a control and power electrical module is additionally assembled, in accordance with some embodiments of the present disclosure. Further, in this view, the antenna brackets 602, 604 are shown assembled in the housing assembly. In this view an electrical module 700 shown disposed over a portion of the floor portions 110, 114 and includes a central shielding 702, a lower or bottom shielding member 704, and a top shielding member 706. Two internal volumes are created by the shielding members 702, 704, 706. The first internal volume is formed between the central shielding member 702 and the top shielding member 706, and a second internal volume is formed between the central shielding member 702 and the bottom shielding member 704. In each of these internal volumes there are disposed different perspective circuits. A control circuit can be housed in the first internal volume between the central shielding member 702 and the top shielding member 706, and a power supply circuit can be housed in the second internal volume between the central shielding member 702 and the bottom shielding member 704. Each of the shielding members 702, 704, 706 provide sidewall portions that extend completely around the module, and the shielding members 702, 704, 706 are made of an electrically conductive material to block emission of signals or noise, as well as to prevent unwanted ingress of noise. The bottom shielding member 704 is mounted on and fastened to the floor portions 110, 114 of the lower housing member 102 such that an electrical connection is made. Likewise, the is also an electrical connection (e.g., a DC connection) between the bottom shielding member 704 and the central shielding member 702 and the top shielding member 706. Further, the central shielding member 702 provides a horizontal conductive floor or separator between the two internal volumes of the module 700, and the top or cover shielding member 706 provides a horizontal cover over the first internal volume while the bottom shielding member 704 provides a bottom cover under the second internal volume of the module 700. Thus, the control circuit and the power supply circuit are arranged in a vertically stacked relationship. In some embodiments there can be a passage between the first and second internal volumes to allow connection of the control circuit with the power supply circuit.

Figure 11:
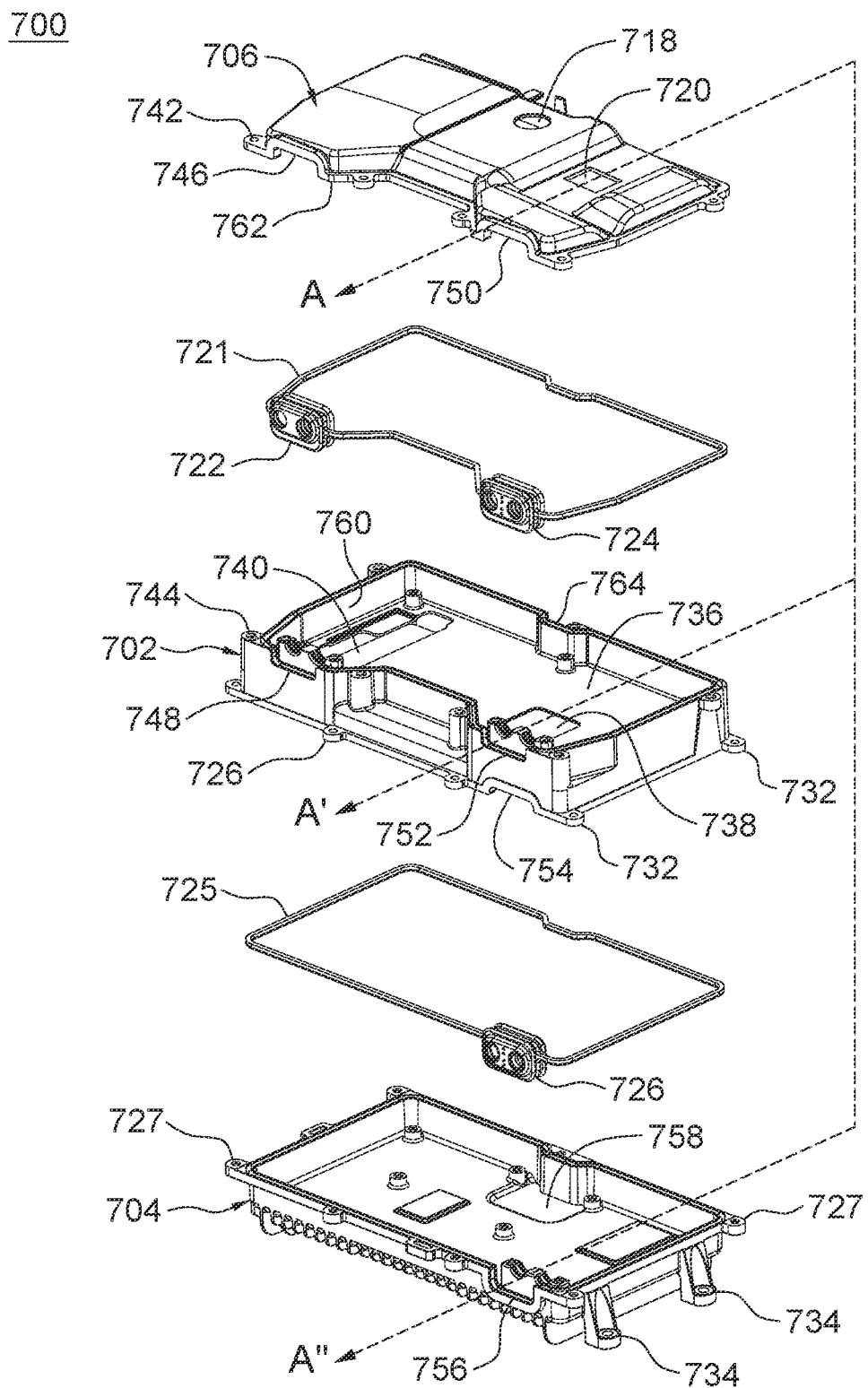
FIG. 11 shows an exploded view of a vertically stacked shielded enclosure, in accordance with some embodiments.

The electrical module 700 is shown in FIG. 11 in and exploded view, without circuit elements. Central shielding element 702 is shown between top shielding element 706 and bottom shielding element 704. These three shielding elements 702, 704, 704 house circuit components in a vertically stacked arrangement. The central shielding element 702 has a floor 736 that is surrounded by a wall 760 that extends both above and below the floor 736. The top 764 of the wall 760 interfaces with a lower periphery 762 of the top shielding element 706, and a first gasket member 721 seals the interface between the central shielding member 702 and the top shielding member 706. Cable ports or cable openings are formed between the top shielding element 706 and central shielding element 702 by raised portions 746 and 750 in the periphery of the top shielding element 706 and corresponding lowered portions 748, 752 in the top 764 of the wall 760 of the central shielding element 702. These raised and lowered portions 746, 748, 750, 752 are portions of the respective shielding elements 702, 706 that deviate away from the interface between these shielding elements 702, 706 to create openings. The openings are filled by cable plugs 722, 724 in the gasket 721. The cable plugs 722, 724 continue the watertight seal of the gasket 712 around the interface between the shielding elements 702, 706, and have openings through them that allow cabling to pass while sealing around the cables. Likewise, an opening is formed between the central shielding element 702 and the bottom shielding element 704 between raised portion 754 in the lower portion of the wall 760 of the central shielding element 702 and a lowered portion 756 in the periphery of the bottom shielding element 704. Cable plug 726 of gasket 725 fits in this opening and provides a watertight seal for cabling to pass into the lower chamber of the electrical module 700. To hold the top shielding element 706 to the central shielding element 702 (with gasket 721 disposed between their peripheries), a plurality of fastener bosses around the periphery of the top shielding element 706, such fastener boss 742, mate with corresponding fastener receivers on the central shielding element 702, such as fastener receiver 744. The fastener bosses engage the head of a fastener (e.g., screw or bolt) while the fastener receivers are threaded so that the fasteners hold the two shielding elements 702, 706 together. Likewise, the central shielding element 702 can have fastener bosses 732 that mate with corresponding fastener receivers 727 on the bottom shielding element 704. In some embodiments the fastener receivers can be replaced with mating fastener bosses and a nut can be used to tighten the two shielding elements together.

When assembled, an upper or top chamber is formed between the floor 736 of central shielding element 702 and the ceiling or top of the top shielding element 706 and surrounded by the wall 760 of the central shielding element 702 and any similar structure of the top shielding element 706 above their interface. Likewise, a lower or bottom chamber is formed between the floor 758 of the bottom shielding element 704 and the floor 736 of the central shielding element 702, and the bottom/lower chamber is surrounded by the walls of the bottom and central shielding elements 704, 702. The central, bottom, and top shielding members 702, 704, 706 are made of a material that inhibits transmission of electromagnetic radiation, in least in radio frequency ranges. In some embodiments the shielding members 702, 704, 706 can be made of aluminum. The bottom shielding member can have feet 734 with fastener openings in them so that the electrical module 700 can be electrically and mechanically coupled to the lower housing member 102, such as by being fastened to bosses extending up from the housing floor 110.

In some embodiments a control circuit can be housed in the top/upper chamber, and a power supply circuit can be housed in the lower/bottom chamber. Power from the power supply circuit can be fed directly to the control circuit through openings 738, 740 in the floor 736 of the central shielding element 702 to minimize any unwanted noise pickup in the power feed cable since they are entirely within the shielding of the electrical module 700. The top of the top shielding element 706 can have an optical port 718 and a satellite location receiver (e.g., GPS) antenna port 720. The optical port 718 is covered with a transparent member and is aligned with corresponding optical window (e.g., window 282 in FIG. 5) in the cover 200. An optical sensor can be located under the optical port that senses ambient light in order to control operation of an external lighting element (e.g., a streetlight). The GPS antenna port allows for the installation of a satellite positioning receiver antenna to receive satellite positioning signals to allow a satellite positioning receiver circuit portion of the control circuit to determine the small cell node's location as well as the present time.

Figure 12:
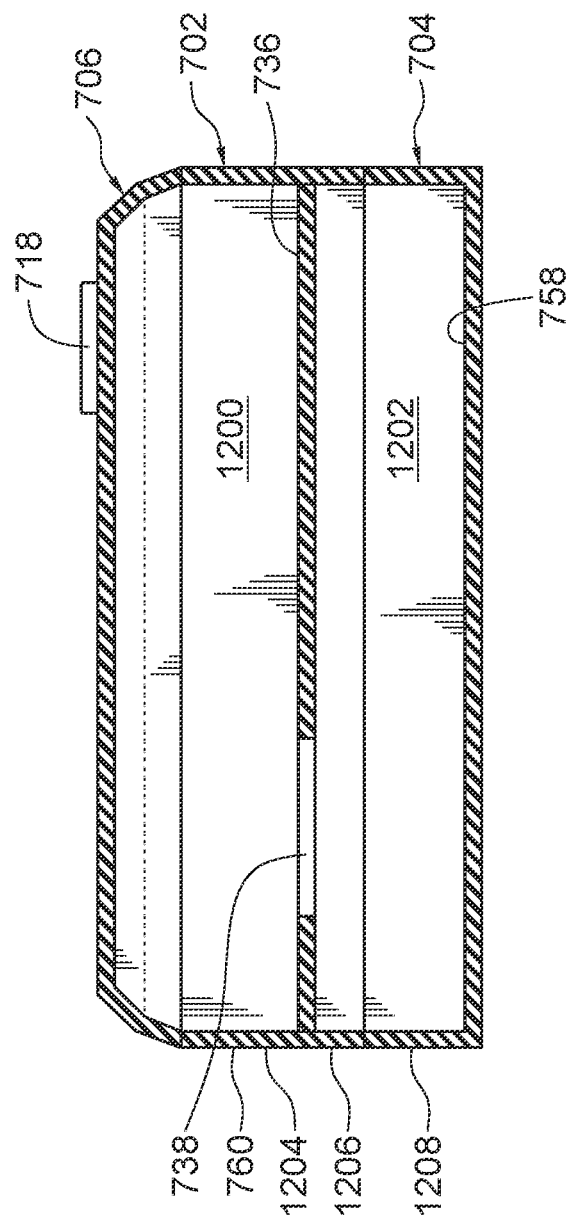
FIG. 12 shows a side cut-away view of vertically stacked shielded enclosure, in accordance with some embodiments.

FIG. 12 shows a side cut-away view of an electrical module that is substantially similar to electrical module 700. The module includes a central shielding element 702, bottom shielding element 704, and a top shielding element 706. As shown here, unlike in FIG. 11, the shielding elements 702, 704, 706 are shown assembled together. The section is taken along the lines A-A'-A" of FIG. 11. A top or upper chamber 1200 is formed between the floor 736 of the central shielding element 702 and the top shielding element 706. A lower or bottom chamber 1202 is formed between the floor 758 of the bottom shielding element 704 and the floor 736 of the central shielding element 702.

Figure 13:
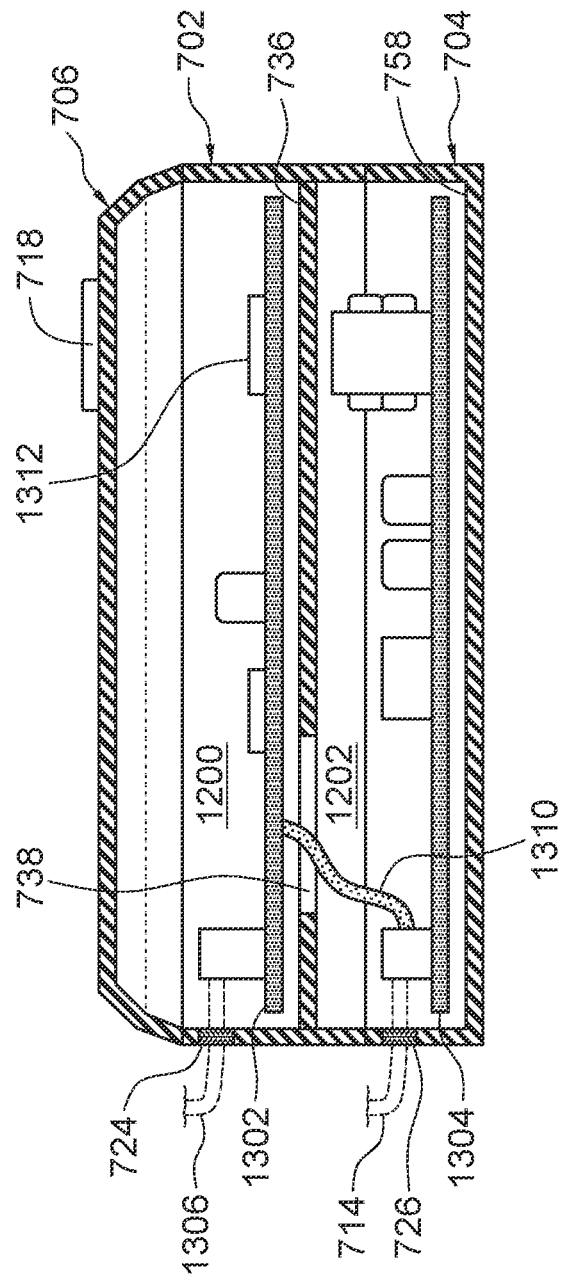
FIG. 13 shows a side cut-away view of vertically stacked shielded enclosure, including circuit elements and cables, in accordance with some embodiments.

FIG. 13 shows the same electrical module as shown in FIG. 12, with the addition of a control circuit 1302 in the upper chamber 1200, and a power supply circuit 1304 in the lower chamber 1202. Power, such as from power connector 138, is fed through cable plug 724 via cable 1306 to the control circuit, and from the control circuit 1302 to the power supply circuit 1304 through opening 738 via interchamber cable 1310. The power supply circuit 1304 converts the electrical power, typically provided as an alternating current (AC) voltage and current source, to direct current (DC) voltage levels usable by the various electrical components of the small cell device. Power can be provided from the power supply circuit 1304 to the control circuit 1302 through the other opening 740 in the floor 736 of the central shielding member 702. The control circuit 1302 operates the radio module 802 at a high level and provides data to the radio module 802 that is transmitted by the radio module 802 to, for example, an administrative entity that is responsible for operation of the small cell device. The control circuit 1302 can also include a photo sensor 1312 that is located under the optical port 718 that is configured to sense the ambient light level, to allow a light control circuit that is configured to control operation of an external lighting element (e.g., turn it on/off based on ambient light level).

Figure 14:
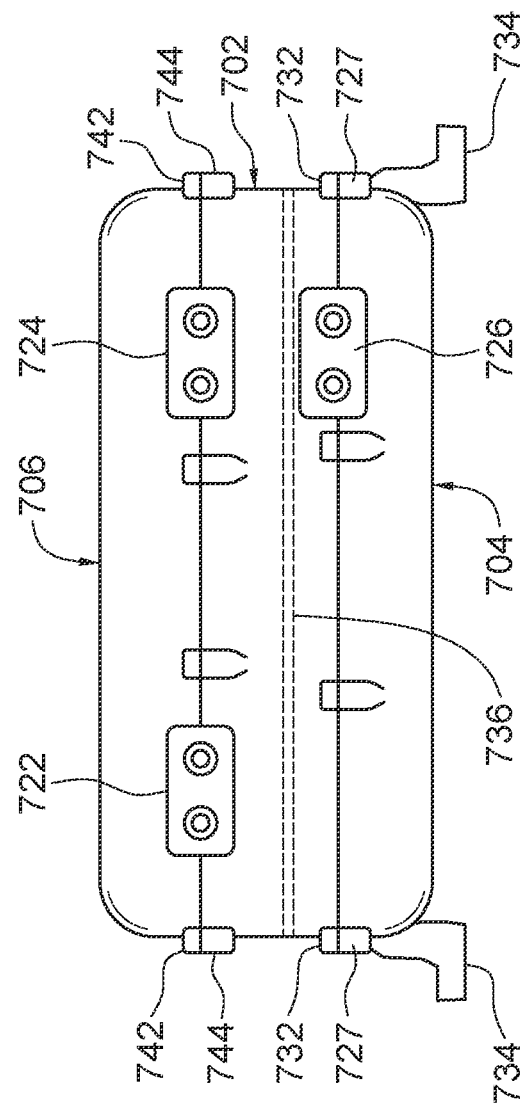
FIG. 14 shows a front side elevational view of vertically stacked shielded enclosure, in accordance with some embodiments.

FIG. 14 shows a front side elevational view of the electrical module including a central shielding element 702, a bottom shielding element 704, and a top shielding element 706. As indicated in reference to FIG. 11, openings are formed between the shielding elements 702, 704, 706 in which gasket plugs 722, 724, 726 are disposed. The gasket plugs are made of a resilient material to conform and seal between the gasket plugs and the shielding elements. Each gasket plug 722, 724, 726 can have cable openings through which cable pass to connect to the circuits housed inside the electrical module. The openings are sized to be slightly smaller than the diameter of the cables to ensure a seal between the cables and the cable plugs.

Thus, the shielded enclosure 700 is an electrical module that is, more specifically, a combination control circuit and power supply module for a small cell access node apparatus that includes a lower shielding member 704 that has a bottom 758 that forms a floor, and a sidewall 781 that extends upwards, away from the bottom 758, around a periphery of the bottom 758. The module includes a central shielding member 702 conductively coupled to the lower shielding member 704, and has a central floor 736, and further has a sidewall 760 around a periphery of the central floor 736. The sidewall 760 of the central shielding member 702 has a lower portion 1206 that extends away from the central floor 736 in a first direction (downward), and which meets the sidewall 781 of the lower shielding member 704. The sidewall 760 of the central shielding member 702 further has an upper portion 1204 that extends (upwards) from the central floor 736 in a second direction opposite that of the first direction, and thereby encloses a lower chamber between the bottom 758 of the lower shielding member 704 and a lower or bottom side of the central floor 736 of the central shielding member 702 and the lower portion 1206 of the sidewall 760 of the central shielding member 702 and the sidewall 781 of the lower shielding member 704. The electrical module further includes a top shielding member 706 conductively coupled to the central shielding member 702 and has a ceiling or top 783 and a sidewall 785. The sidewall 785 of the top shielding member 706 extends away from the ceiling 783 about a periphery of the ceiling 783 to meet the upper portion of the sidewall 760 of the central shielding member 702 thereby enclosing an upper chamber between an upper side of the central floor 736 and the ceiling 783 of the top shielding member 706 and by the upper portion 1204 of the sidewall 760 of the central shielding member 702 and the sidewall 785 of the top shielding member 706. The electrical module can include a power supply circuit 1304 disposed in the lower chamber 1202, and a control circuit 1302 disposed in the upper chamber 1200.

Returning to FIG. 7 there is also shown a fan unit 708 that includes one or more fans and is located near the rear air intake grate 108 of the rear wall 106 of the lower housing member 102. The fan unit 708, as shown here, includes two outer fans 710 and two inner fans 712. The outer fans 710 are positioned and oriented to blow air along the sides of the housing assembly while the inner fans 712 are positioned to blow air under the electrical module(s) housed inside the housing assembly. The fan unit 708 receives power via a fan power cable 716 from the power supply circuit in front electrical module 700. A radio power cable 714 is also shown that provides power to the radio module (not shown here). Both the fan power cable 716 and the radio power cable 714 can be shielded to reduce unwanted noise intrusion or transmission into or from the cables 714, 716.

Figure 8:
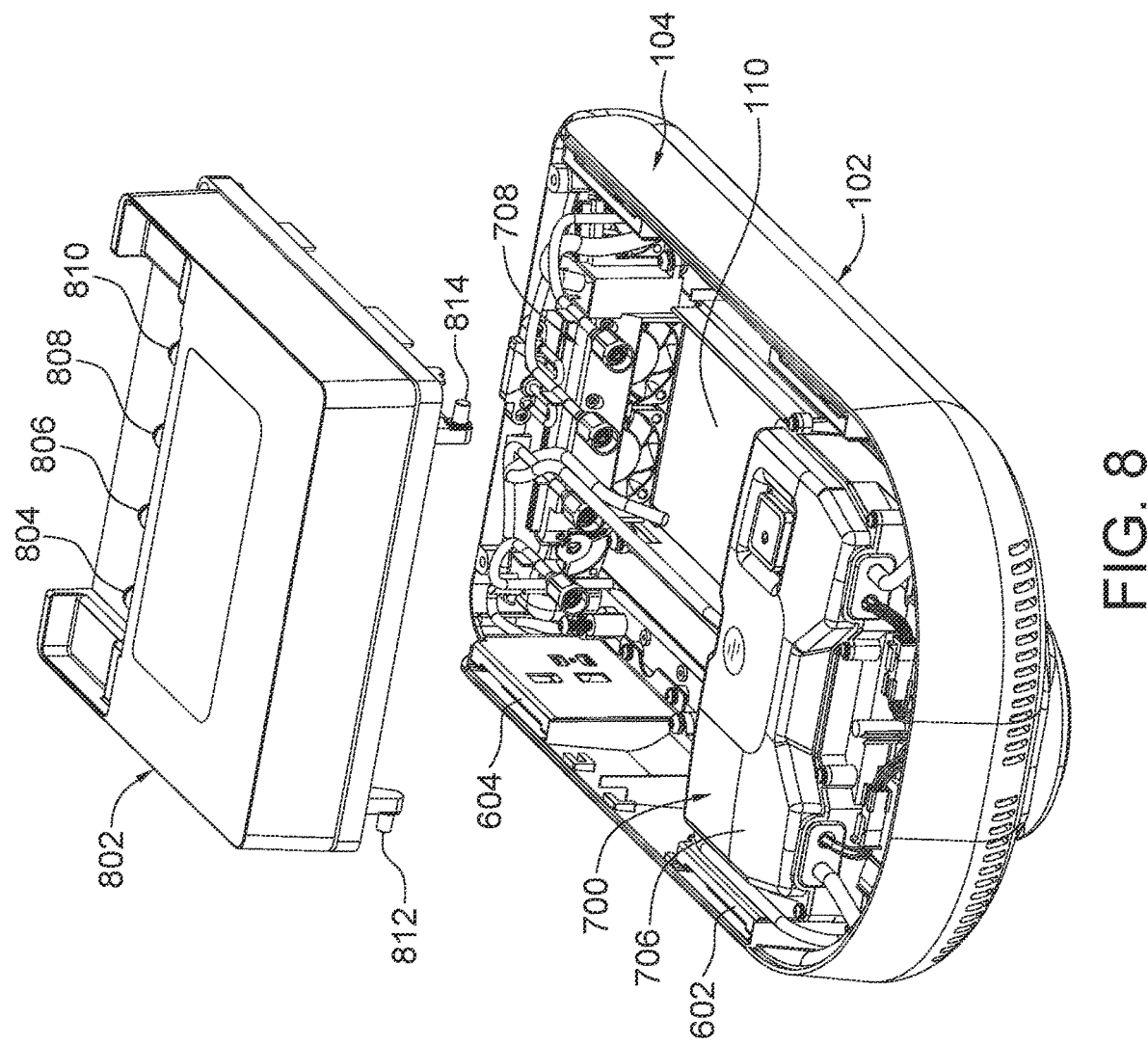
FIG. 8 shows a front perspective view partially assembled housing system for a small cell access node device as shown in FIG. 7 and in which a radio module is additionally assembled, in accordance with some embodiments of the present disclosure.

FIG. 8 shows a front perspective view partially assembled housing system for a small cell access node device as shown in FIG. 7 and in which a radio module 802 is additionally assembled, in accordance with some embodiments of the present disclosure. In addition to the front electrical module 700, the housing assembly can further include a radio module 802. The radio module includes radio circuitry for wireless communications as a small cell device, including communicating locally with mobile devices, and relaying signals between mobile devices and a terrestrial communications infrastructure for voice and data communications. The radio module 802 includes a plurality of antenna connectors 804, 806, 808, 810 that are used to connect to connectors 634, 636, 638, 640 and thereby to the antenna elements on antenna brackets 602, 604, 606, 608. This arrangement allows the radio module to operate according to a multiple-input, multiple-output (MIMO) radio interface configuration. The radio power cable 714 provides power to the radio module, and inner fans 712 blow air over fins on the bottom of the radio module 802. The radio module 802 sits between the electrical module 702 and the fan unit 708 over the floor portions 110, 114 of the lower housing member 102. At the bottom of the front side of the radio module 802 are a pair of opposing mounting rods 812, 814. The mounting rods 812, 814 are horizontally oriented with one at each of the lower front corners, along a coaxial axis, and are configured to fit into receiving hooks 142, 140, respectively, on the floor portions 110, 114 of the lower housing member 102. This allows the radio module to be inserted into, or removed from, the assembled housing assembly through door 208. The radio module 802 includes a conductive housing that provides radio shielding, and which can be fastened to the floor portions 110, 114 in addition to engagement of the mounting rods 812, 814 with receiving hooks 140, 142. When the mounting rods 812, 814 are engaged in the receiving hooks 140, 142 then other fastener locations on the radio module 802 will be aligned with fastener bosses on the floor portions 110, 114 of the lower housing member 102.

Figure 9:
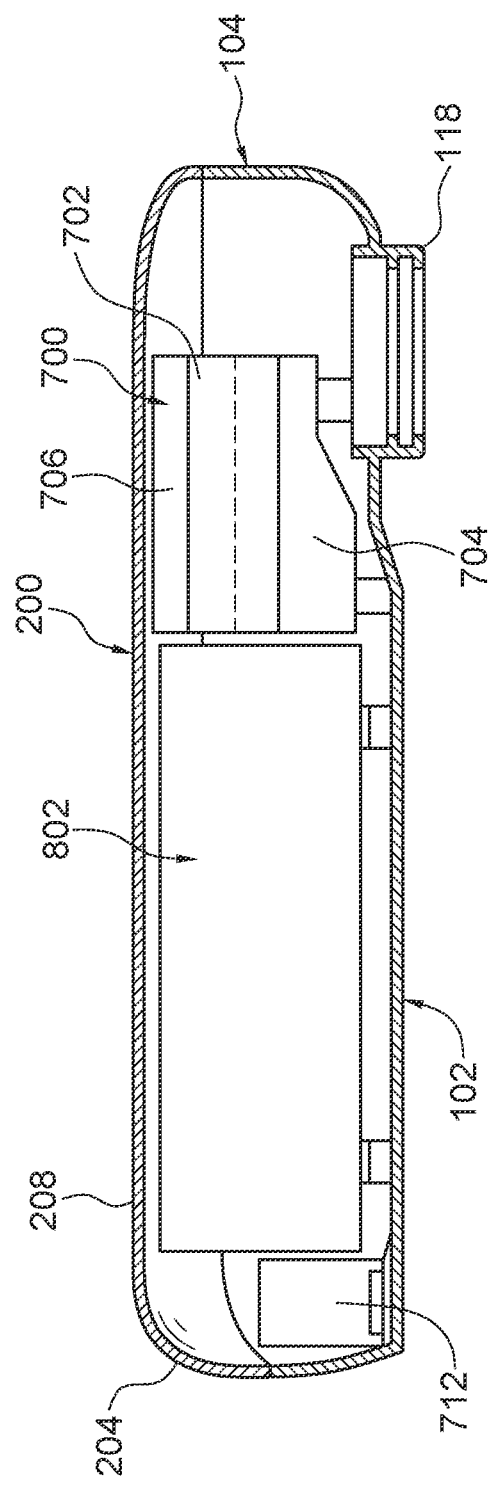
FIG. 9 shows a partial side cutaway view of an assembled small cell access node device, in accordance with some embodiment of the present disclosure.

FIG. 9 shows a partial side cutaway view of an assembled small cell access node device, in accordance with some embodiment of the present disclosure. In the present view of FIG. 9, the lower housing member 102, sidewall housing member 104, cover housing member 200 and door 208 are sectioned along a line through the middle of the assembly in a direction from the front to the back of the assembly. The interior components are represented positionally, and not necessarily cross sectioned. As used herein, the front of the device is on the right side, and the rear or back of the device is on the left side of the drawing. Inside the housing members 102, 104, 200 the electrical module 700 is housed, and includes the top shielding member 706, the central shielding member 702, and the bottom shielding member 704. The electrical module 700 is disposed over a portion of the floor of the lower housing member 102 that is raised or elevated with respect to the more rearward section of the that is occupied by the radio module 802. Both the electrical module 700 and radio module 802 are fastened to the lower housing member 102. Note that other elements such as, for example, the antenna brackets, are not shown in this view, but such elements as shown in the preceding drawings would be present in the assembled and operational device.

Figure 10:
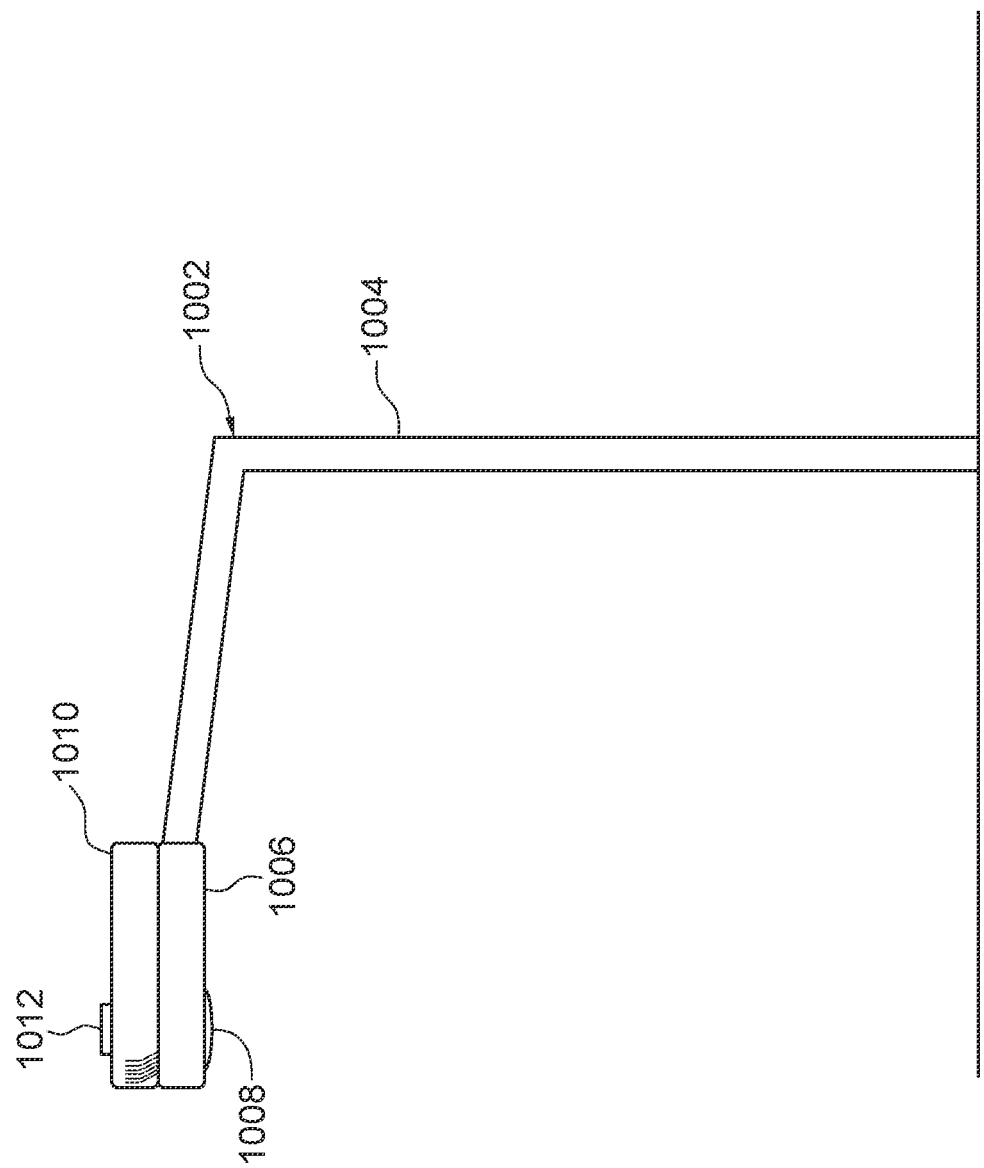
FIG. 10 shows a small cell access node device mounted on a streetlight, in accordance with some embodiments.

FIG. 10 shows a small cell access node device mounted on a streetlight, in accordance with some embodiments. The street light 1002 includes a mast 1004 and a light element 1006. The mast 1004 can include a ground-mounted pole that generally extends upward from the ground and then extends outward over the ground/street. The light element 1006 includes circuitry and a lamp 1008 that emits light downward towards the ground below. In some embodiments the mast 1004 can extend from a structure (e.g., a bridge or building) rather than being mounted in the ground. The light element 1006 includes, on its top side an electrical connector. The small cell access node device 1010 is mounted on top of the light element 1006 and is configured and assembled substantially as shown in the preceding drawings. Thus, an electrical connector of the small cell access node device 1010, such as electrical connector 138, can mate with the electrical connector on the top of the light element 1006. The small cell access node device 1010 can itself include an electrical connector such as connector 212 on its cover/top. The materials used in the constructing the small cell access node device 1010 help minimize its weight and volume, which are important when mounting on the light element 1006 because the mounting of the light element 1006 on the mast 1004 must meet specified loading requirements.

The foregoing disclosure has described embodiments of a small cell access node device housing assembly. The assembly utilizes an electrically conductive lower housing member that provides sufficient rigidity and strength to support the assembly and the components contained within the housing assembly. Being conductive, the lower housing member also provides a shielding benefit for electromagnetic noise. By making the remaining portions of the housing assembly out of non-conductive materials, the weight of the assembly is minimized, and the antenna elements can be housing inside the assembly, rather than the being externally mounted, which can enhance the aesthetic appeal of the small cell access node device.

The claims appended hereto are meant to cover all modifications and changes within the scope and spirit of the present disclosure.

What is claimed is:

1. An electronic apparatus comprising:
   a housing including:
      an electrically conductive housing floor,
      an electrically non-conductive housing sidewall disposed about a periphery of the housing floor, and
      an electrically non-conductive housing cover engaged with the housing sidewall but not the housing floor, wherein the housing floor, the housing sidewall, and the housing cover define an internal chamber of the housing;
   an electrically conductive enclosure positioned within the internal chamber of the housing and electrically coupled to the housing floor, the enclosure defining a first shielded chamber and a second shielded chamber in a vertically stacked arrangement;
   a first circuit positioned within the first shielded chamber; and
   a second circuit positioned within the second shielded chamber.

2. The electronic apparatus of claim 1, wherein the first circuit is a power supply circuit and wherein the second circuit is a control circuit.

3. The electronic apparatus of claim 1, wherein the enclosure includes:
   a first shield member having a first floor and a first sidewall that extends away from the first floor around a periphery of the first floor, the first shield member being electrically coupled to the housing floor;
   a second shield member electrically coupled to the first shield member and having a second floor and a second sidewall, a first portion of the second sidewall extending away from the second floor in a first direction, a second portion of the second sidewall extending away from the second floor in a second direction opposite the first direction and engaging the first sidewall; and
   a third shield member electrically coupled to the second shield member and having a cover and a third sidewall, the third sidewall extending away from the cover about a periphery of the cover and engaging the first portion of the second sidewall;

wherein the first floor, the first sidewall, the second portion of the second sidewall and the second floor define the first shielded chamber and wherein the second floor, the first portion of the second sidewall, the third sidewall and the cover define the second shielded chamber.

4. The electronic apparatus of claim 1, wherein the enclosure comprises:
a first shield member, a second shield member, and a third shield member in a vertically stacked arrangement,
wherein the first shield member is electrically coupled to the housing floor,
wherein the first shield member, the second shield member, and the third shield member are electrically coupled together,
wherein intercoupling of the first shield member and the second shield member defines the first shielded chamber, and
wherein intercoupling of the second shield member and the third shield member defines the second shielded chamber.

5. The electronic apparatus of claim 1, wherein the enclosure includes a cover member, the cover member defining an optical port and including a transparent window disposed over the optical port.

6. The electronic apparatus of claim 5, wherein the electronic apparatus is mountable to an aerial light fixture, wherein the housing cover defines a second optical port, wherein the enclosure is positioned within the internal chamber of the housing such that the optical port of the cover member of the enclosure substantially aligns with the second optical port, wherein the first circuit includes a light control circuit and is oriented within the first shielded chamber such that a light sensor of the light control circuit is positioned under the transparent window of the cover member of the enclosure, and wherein the light control circuit controls light output of the light fixture based at least in part on an ambient light level detected by the light sensor through the transparent window.

7. The electronic apparatus of claim 1, further comprising:
a radio module positioned within the internal chamber of the housing and horizontally adjacent to the enclosure, wherein the radio module enables the electronic apparatus to provide small cell functionality.

8. The electronic apparatus of claim 1, wherein the first circuit is a power supply circuit, the electronic apparatus further comprising:
an electrical power connector that passes alternating current (AC) electrical power through a first opening defined by the housing floor;
a first power cable connected to the electrical power connector, the first power cable routing the AC electrical power to the power supply circuit; and
a second power cable that routes direct current (DC) power output from the power supply circuit to the second circuit through at least a second opening defined by the first shielded chamber and the second shielded chamber.

9. A small cell access node comprising:
a housing including:
an electrically conductive housing floor,
an electrically non-conductive housing sidewall disposed about a periphery of the housing floor, and
an electrically non-conductive housing cover engaged with the housing sidewall but not the housing floor, wherein the housing floor, the housing sidewall, and the housing cover define an internal chamber of the housing;
an electrically conductive enclosure positioned within the internal chamber of the housing and electrically coupled to the housing floor, the enclosure defining a first shielded chamber and a second shielded chamber in a vertically stacked arrangement;
an AC-to-DC power supply circuit positioned within the first shielded chamber;
a control circuit positioned within the second shielded chamber, the control circuit receiving DC power from the power supply circuit; and
a radio module disposed within the internal chamber of the housing horizontally adjacent to the enclosure and receiving DC power from the power supply circuit.

10. The small cell access node of claim 9, wherein the enclosure includes:
a first shield member having a first floor and a first sidewall that extends away from the first floor around a periphery of the first floor, the first shield member being electrically coupled to the housing floor;
a second shield member electrically coupled to the first shield member and having a second floor and a second sidewall, a first portion of the second sidewall extending away from the second floor in a first direction, a second portion of the second sidewall extending away from the second floor in a second direction opposite the first direction and engaging the first sidewall; and
a third shield member electrically coupled to the second shield member and having a cover and a third sidewall, the third sidewall extending away from the cover about a periphery of the cover and engaging the first portion of the second sidewall;
wherein the first floor, the first sidewall, the second portion of the second sidewall, and the second floor define the first shielded chamber and wherein the second floor, the first portion of the second sidewall, the third sidewall, and the cover define the second shielded chamber.

11. The small cell access node of claim 9, wherein the enclosure comprises:
a first shield member, a second shield member, and a third shield member in a vertically stacked arrangement,
wherein the first shield member is electrically coupled to the housing floor,
wherein the first shield member, the second shield member, and the third shield member are electrically coupled together,
wherein intercoupling of the first shield member and the second shield member defines the first shielded chamber, and
wherein intercoupling of the second shield member and the third shield member defines the second shielded chamber.

12. The small cell access node of claim 9, wherein the enclosure includes a cover member, the cover member defining an optical port and including a transparent window disposed over the optical port.

13. The small cell access node of claim 12, wherein the housing is mountable to an aerial light fixture, wherein the housing cover defines a second optical port, wherein the enclosure is positioned within the internal chamber of the housing such that the optical port of the cover member of the enclosure substantially aligns with the second optical port, wherein the control circuit is oriented within the first shielded chamber such that a light sensor of the control circuit is positioned under the transparent window of the cover member of the enclosure, and wherein the control circuit controls light output of the light fixture based at least in part on an ambient light level detected by the light sensor through the transparent window.

14. The small cell access node of claim 9, further comprising:
an electrical power connector that passes alternating current (AC) electrical power through a first opening defined by the housing floor;
a first power cable connected to the electrical power connector, the first power cable routing the AC electrical power to the power supply circuit; and
a second power cable that routes direct current (DC) power output from the power supply circuit to the control circuit through at least a second opening defined by the first shielded chamber and the second shielded chamber.

15. The small cell access node of claim 9, further comprising:
a satellite location receiver port formed in a cover of the enclosure;
a satellite location receiver antenna disposed in the satellite location receiver port; and
a satellite location receiver circuit coupled to the satellite location receiver antenna and forming part of the control circuit.

16. A multi-chambered, electrically conductive enclosure for use in an electronic apparatus, the enclosure comprising:
a first shield member having a first floor and a first sidewall that extends away from the first floor around a periphery of the first floor;
a second shield member electrically coupled to the first shield member and having a second floor and a second sidewall, a first portion of the second sidewall extending away from the second floor in a first direction, a second portion of the second sidewall extending away from the second floor in a second direction opposite the first direction and engaging the first sidewall; and
a third shield member electrically coupled to the second shield member and having a cover and a third sidewall, the third sidewall extending away from the cover about a periphery of the cover and engaging the first portion of the second sidewall;
wherein the first floor, the first sidewall, the second portion of the second sidewall, and the second floor define a first shielded chamber, wherein the second floor, the first portion of the second sidewall, the third sidewall, and the cover define a second shielded chamber, and wherein the first shielded chamber and the second shielded chamber are in a vertically stacked orientation.

17. The enclosure of claim 16, wherein the second floor defines at least one opening.

18. The enclosure of claim 16, further comprising:
a first cable port positioned at a first interface between the first sidewall and the second portion of the second sidewall;
a first gasket disposed along the first interface and the first cable port;
a second cable port positioned at a second interface between the first portion of the second sidewall and the third sidewall; and
a second gasket disposed along the second interface and the second cable port.

19. The enclosure of claim 16, wherein the cover defines an optical port and includes a transparent window disposed over the optical port.

20. The enclosure of claim 16, further comprising:
a satellite location receiver port formed in the cover; and
a satellite location receiver antenna disposed in the satellite location receiver port.

* * * * *